(12) United States Patent
Fukuzumi

(10) Patent No.: US 9,608,001 B2
(45) Date of Patent: Mar. 28, 2017

(54) SEMICONDUCTOR MEMORY DEVICE

(71) Applicant: Kabushiki Kaisha Toshiba, Minato-ku (JP)

(72) Inventor: Yoshiaki Fukuzumi, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/833,202

(22) Filed: Aug. 24, 2015

(65) Prior Publication Data

US 2016/0268288 A1 Sep. 15, 2016

Related U.S. Application Data

(60) Provisional application No. 62/132,879, filed on Mar. 13, 2015.

(51) Int. Cl.
*G11C 16/04* (2006.01)
*H01L 27/115* (2017.01)
*H01L 29/423* (2006.01)
*G11C 5/02* (2006.01)

(52) U.S. Cl.
CPC .... *H01L 27/11578* (2013.01); *G11C 16/0483* (2013.01); *H01L 27/11568* (2013.01); *H01L 29/42344* (2013.01); *G11C 5/025* (2013.01)

(58) Field of Classification Search
CPC .......... G11C 16/06; G11C 16/10; G11C 16/26
USPC .................................................... 365/185.18
See application file for complete search history.

(56) References Cited

U.S. PATENT DOCUMENTS

| | | | |
|---|---|---|---|
| 7,936,004 | B2 | 5/2011 | Kito et al. |
| 8,044,448 | B2 | 10/2011 | Kamigaichi et al. |
| 8,194,453 | B2 | 6/2012 | Maejima |
| 8,237,211 | B2 | 8/2012 | Fukuzumi et al. |
| 8,372,720 | B2 | 2/2013 | Fukuzumi et al. |
| 8,390,055 | B2 | 3/2013 | Higashi et al. |
| 8,492,824 | B2 | 7/2013 | Yahashi |
| 8,551,838 | B2 | 10/2013 | Kito et al. |
| 8,729,624 | B2 | 5/2014 | Fukuzumi et al. |
| 8,957,471 | B2 | 2/2015 | Fukuzumi |

(Continued)

OTHER PUBLICATIONS

Yosuke Komori et al. "Disturbless Flash Memory Due to High Boost Efficiency on BiCS Structure and Optimal Memory Film Stack for Ultra High Density Storage Device", 2008 IEEE International Electron Devices Meeting, 2008, 4 pages.

*Primary Examiner* — Huan Hoang
(74) *Attorney, Agent, or Firm* — Oblon, McClelland, Maier & Neustadt, L.L.P.

(57) ABSTRACT

According to one embodiment, a semiconductor memory device includes a substrate; a first stacked body provided on the substrate, the first stacked body including a plurality of electrode layers and a plurality of insulating layers, each of the plurality of insulating layers being provided between the plurality of electrode layers; a semiconductor film provided in the first stacked body and extending in a stacking direction of the first stacked body; and a second stacked body provided on the substrate and separately from the first stacked body, the second stacked body including a same layer structure as the first stacked body. The second stacked body includes a first contact portion electrically connected to an external portion; and a second contact portion electrically connected to an external portion different from the first contact portion.

14 Claims, 8 Drawing Sheets

(56) References Cited

U.S. PATENT DOCUMENTS

| | | |
|---|---|---|
| 9,035,374 B2 | 5/2015 | Fukuzumi et al. |
| 9,064,735 B2 | 6/2015 | Kito et al. |
| 2007/0252201 A1 | 11/2007 | Kito et al. |
| 2010/0207195 A1 | 8/2010 | Fukuzumi et al. |
| 2011/0284947 A1 | 11/2011 | Kito et al. |
| 2011/0287597 A1 | 11/2011 | Kito et al. |
| 2012/0132983 A1 | 5/2012 | Fukuzumi |
| 2013/0056816 A1 | 3/2013 | Iwase et al. |
| 2013/0126961 A1 | 5/2013 | Fukuzumi et al. |
| 2014/0217493 A1 | 8/2014 | Fukuzumi et al. |
| 2015/0200204 A1 | 7/2015 | Fukuzumi et al. |
| 2016/0056210 A1* | 2/2016 | Takaki .............. H01L 21/32139 257/5 |

\* cited by examiner

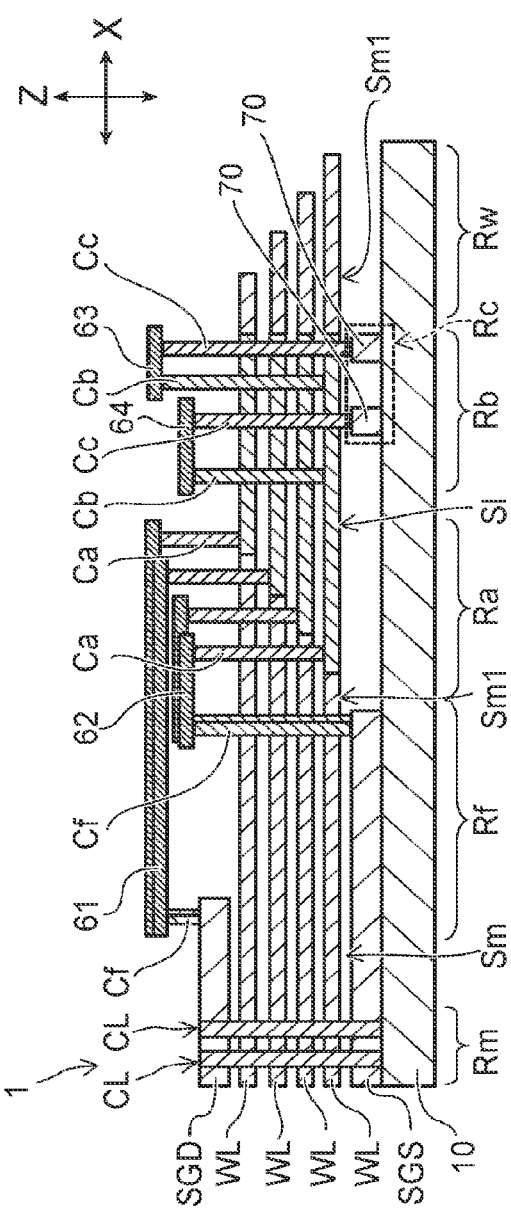
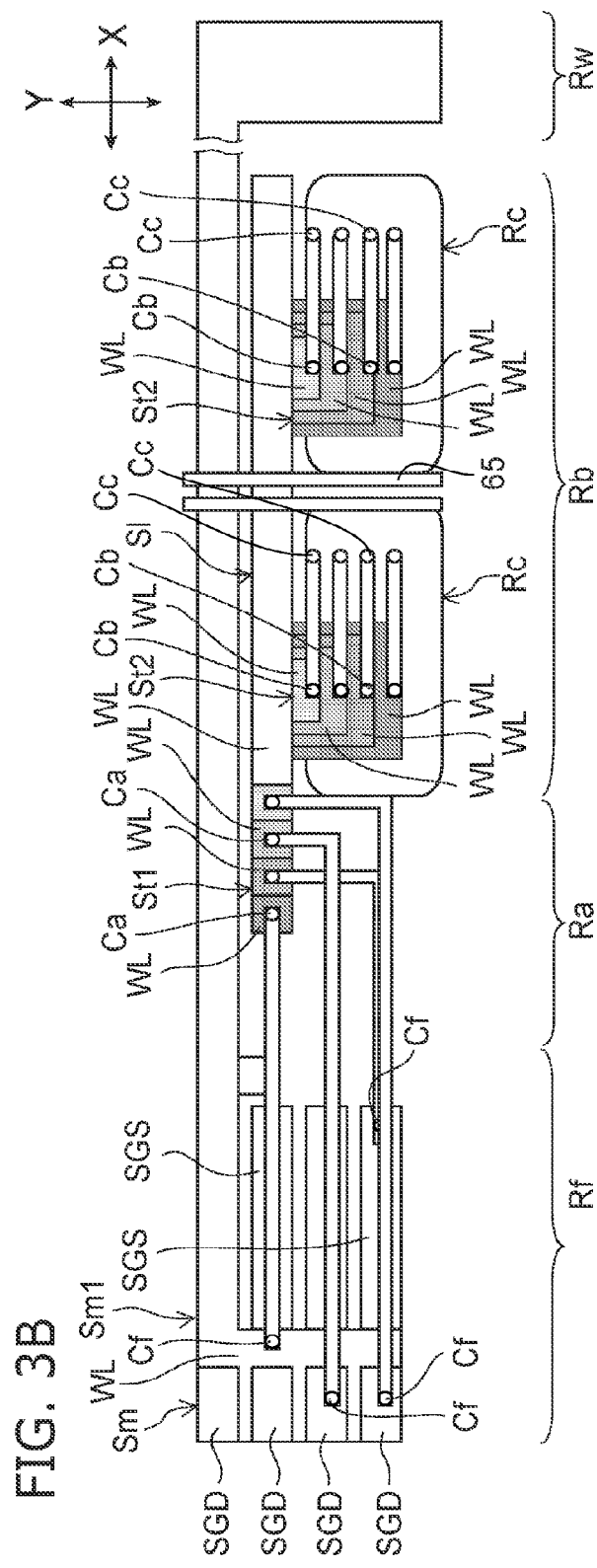
FIG. 3A
FIG. 3B

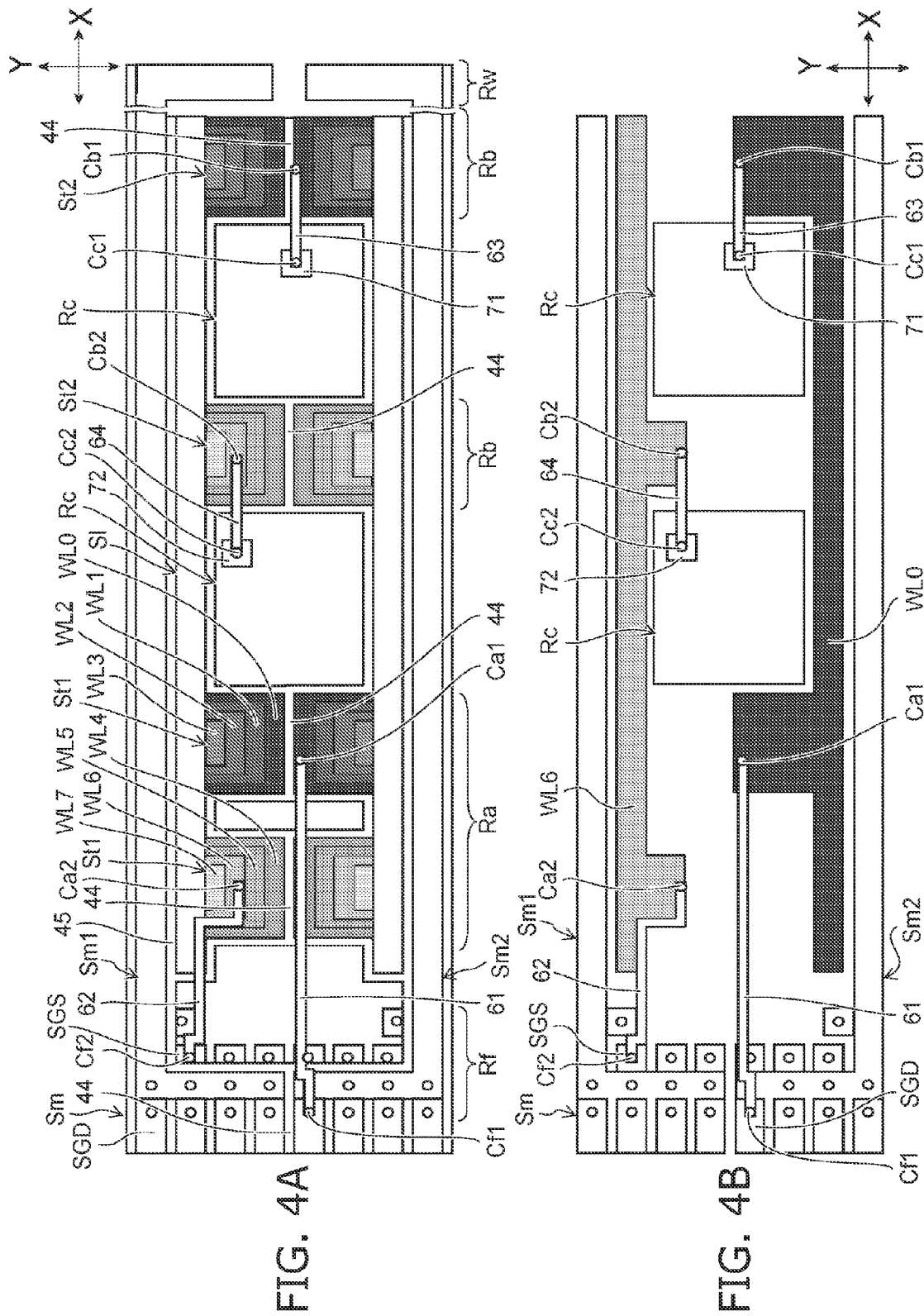

SEMICONDUCTOR MEMORY DEVICE

CROSS-REFERENCE TO RELATED APPLICATIONS

This application is based upon and claims the benefit of priority from U.S. Provisional Patent Application 62/132,879 filed on Mar. 13, 2015; the entire contents of which are incorporated herein by reference.

FIELD

Embodiments described herein relate generally to a semiconductor memory device.

BACKGROUND

A memory device having a three dimensional configuration is provided. In the memory device, a memory hole is formed in a stacked body on which a plurality of electrode layers functioning as a control gate in a memory cell is stacked intermediated by insulating layers, and a silicon body that becomes a channel on the sidewall of the memory hole intermediated by a charge storage film is provided.

As the number of stacks of the stacked body increases in the memory device, the number of interconnects connecting to a stacked body also increase. As a result, this configuration may lead to expansion of the memory device.

BRIEF DESCRIPTION OF THE DRAWINGS

FIG. 3A is a schematic cross-sectional view of the semiconductor memory device in the embodiment, and FIG. 3B is a schematic plan view of the semiconductor memory device in the embodiment;

FIGS. 4A and 4B are schematic plan views of the semiconductor memory device in the embodiment;

DETAILED DESCRIPTION

Figure 1:
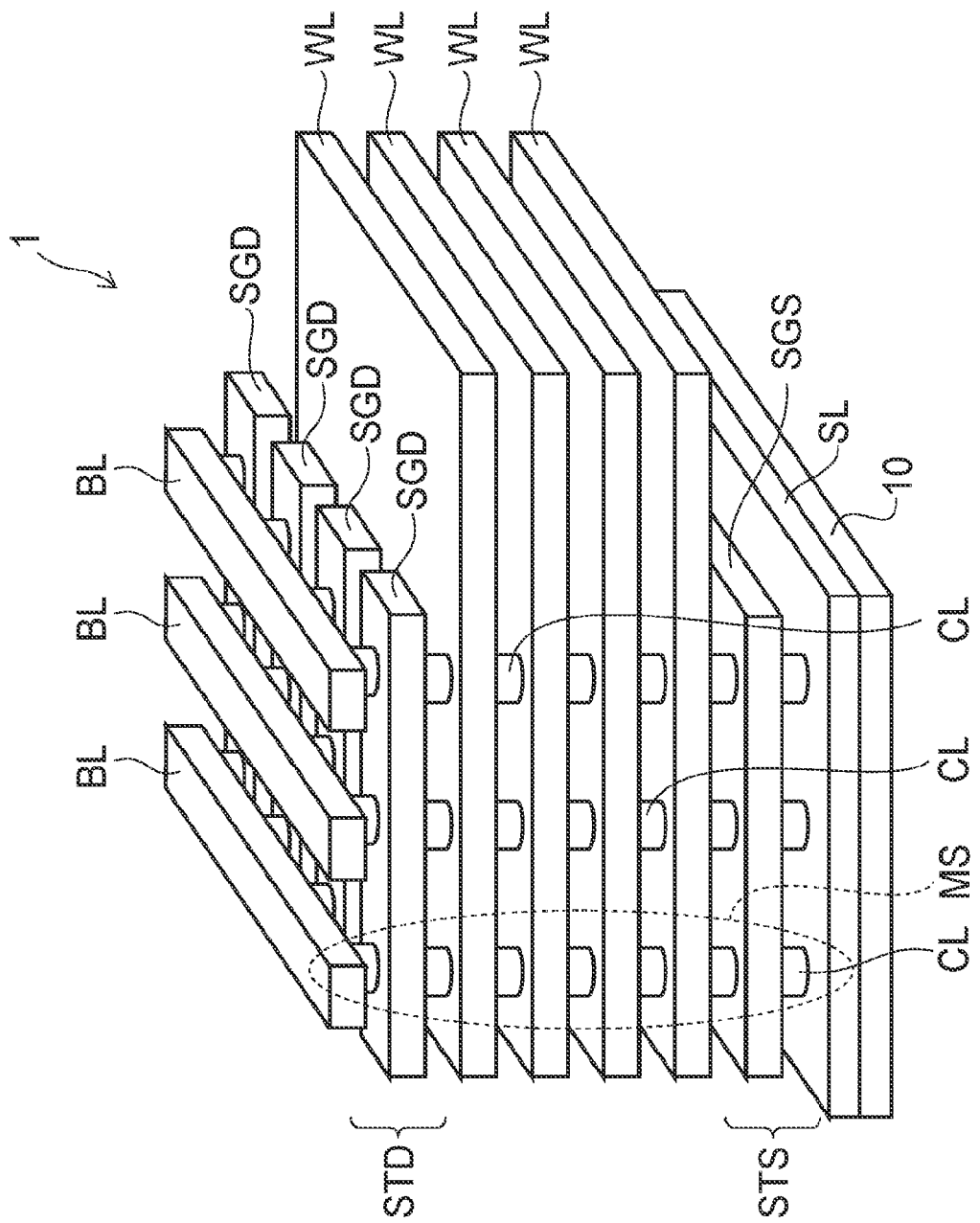
FIG. 1 is a schematic perspective view of a memory cell array in an embodiment.

According to one embodiment, a semiconductor memory device includes a substrate; a first stacked body provided on the substrate, the first stacked body including a plurality of electrode layers and a plurality of insulating layers, each of the plurality of insulating layers being provided between the plurality of electrode layers; a semiconductor film provided in the first stacked body and extending in a stacking direction of the first stacked body; and a second stacked body provided on the substrate and separately from the first stacked body, the second stacked body including a same layer structure as the first stacked body. The second stacked body includes a first contact portion electrically connected to an external portion; and a second contact portion electrically connected to an external portion different from the first contact portion.

Embodiments will be described below with reference to drawings. Note that the same reference numerals are applied for the same elements in each drawing.

FIG. 1 is a schematic perspective view of a memory cell array 1 in accordance with an embodiment. In FIG. 1, illustrations of an insulating layer or the like are omitted for simplicity of understanding.

In FIG. 1, two directions that are parallel to the major surface of a substrate 10 and orthogonal to one another are defined as the X-axis direction and the Y-axis direction and a direction orthogonal to both X and Y-directions is defined as the Z-axis direction (stacking direction).

FIG. 3A is a schematic cross-sectional view of a memory region Rm and a peripheral region parallel to the X and Z planes in which a plurality of the memory cell arrays 1 in accordance with an embodiment in FIG. 1 is provided. In FIG. 3A, the illustration of a source layer SL, the insulating layer, and the configuration above a drain-side select gate SGD and the like are omitted.

The source layer SL is provided on the substrate 10. A source-side select gate SGS (lower select gate or lower gate layer) is provided on the source layer SL intermediated by the insulating layer.

The insulating layer is provided on the source-side select gate SGS. The stacked body is provided on the insulating gate SGS. The stacked body includes a plurality of electrode layers WL and a plurality of insulating layers 40 (see FIG. 2) (a first stacked body Sm). The plurality of electrode layers WL is separately stacked each other, and each of the plurality of insulating layers 40 is provided between the plurality of electrode layers WL. Thus, each of the plurality of electrode layers WL and each of the plurality of the insulating layers 40 are alternatively stacked. The number of layers of the electrode layer WL illustrated on the drawings is an example, and the number of layers of the electrode layer WL may be arbitrary.

The insulating layer is provided on the topmost layer of the electrode layer WL and the drain-side select gate SGD (upper select gate or upper gate layer) is provided on the insulating layer.

The source-side select gate SGS, the drain-side select gate SGD, and the electrode layers WL include a conductive film. For example, the source-side select gate SGS, the drain-side select gate SGD, and the electrode layers include a silicon layer containing silicon as the major component, and the silicon layer may be doped with, for example, impurities that impart conductivity. Further, the source-side select gate SGS, the drain-side select gate SGD and the electrode layer WL may contain at least either a metal or a metal compound. The insulating layer 40 contains, for example, mainly silicon oxide.

A column CL extending along the Z-axis direction is provided in the stacked body. The column CL is formed, for example, in a circular column shape or an elliptic column shape.

Figure 2:
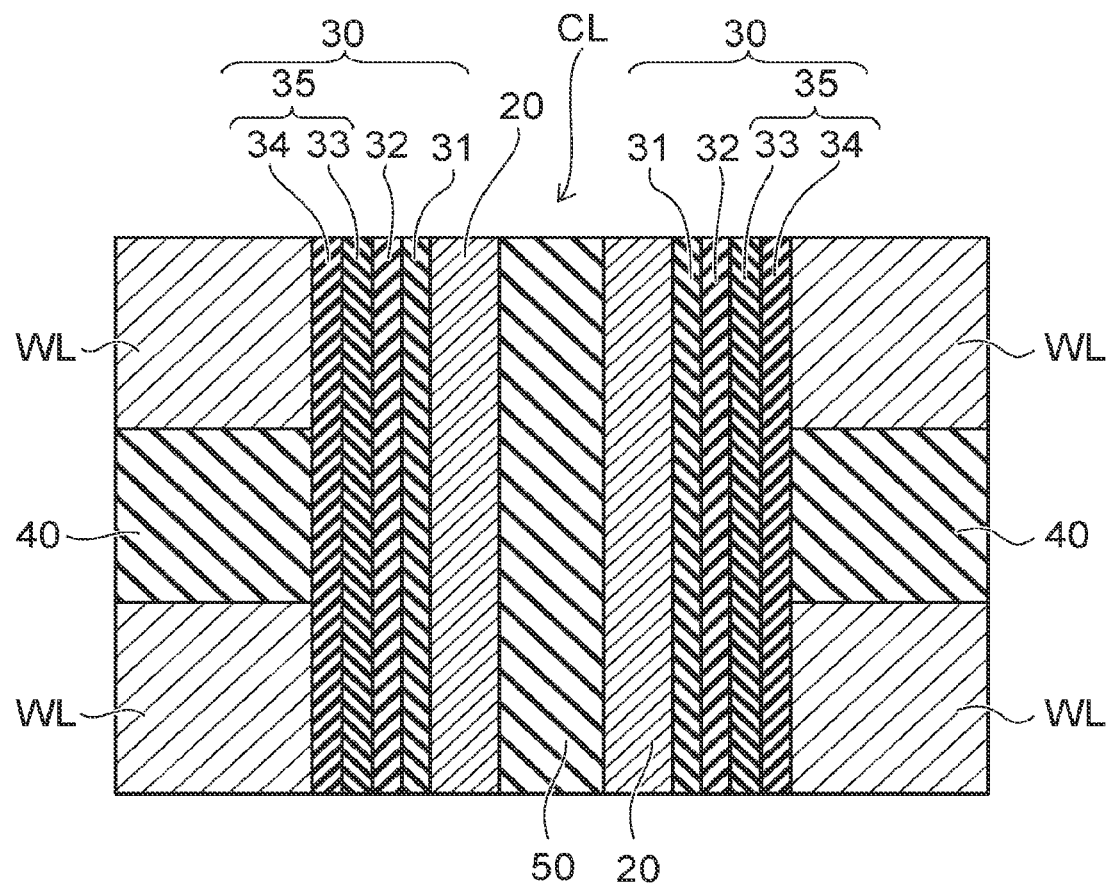
FIG. 2 is an enlarged schematic cross-sectional view of the column in the embodiment.

FIG. 2 is an enlarged schematic cross-sectional view of the column CL in accordance with an embodiment.

The column CL is provided in the memory hole, the memory hole is provided in the first stacked body Sm. In the memory hole, a channel body 20 (semiconductor film) is provided as a semiconductor channel. The channel body 20 is for example, a silicon film containing silicon as the major component. The impurity concentration of the channel body 20 is less than, for example, the impurity concentration of the electrode layer WL.

The channel body 20 is provided in the first stacked body Sm and extends in the stacking direction of the first stacked body Sm (Z-axis direction). The top end of the channel body 20 is connected to a bit line BL (e.g., metal film) illustrated in FIG. 1, and a part of the bottom end side of the channel body 20 is connected to the source layer SL. Each of the plurality of bit lines BL extends in the Y-axis direction.

A memory film 30 is provided between the inner wall of the memory hole and the channel body 20. The memory film 30 includes a block insulating film 35, a charge storage film 32 and a tunnel insulating film 31. The memory film 30 extends in the stacking direction (Z-axis direction) of the stacked body.

Between the electrode layer WL and the channel body 20, the block insulating film 35, the charge storage film 32 and the tunnel insulating film 31 are provided in that order from the electrode layer WL side. The block insulating film 35 contacts the electrode layer WL, the tunnel insulating film 31 contacts the channel body 20, and the charge storage film 32 is provided between the block insulating film 35 and the tunnel insulating film 31.

The channel body 20 is provided having a cylindrical shape, and extends in the stacking direction of the stacked body. The memory film 30 is provided having a cylindrical shape, extends in the stacking direction of the stacked body, and surrounds the outer periphery face of the channel body 20. The electrode layers WL surround the periphery of the channel body 20 intermediated by the memory film 30. Also, a core insulating film 50 is provided on an inner side of the channel body 20. The core insulating film 50 is, for example, a silicon oxide film.

The channel body 20 functions as a channel of the memory cell and the electrode layer WL functions as a control gate of the memory cell. The charge storage film 32 functions as a data memory layer, the data memory layer accumulates electric charges injected from the channel body 20. In other words, the memory cell has a configuration in which a control gate surrounds the channel periphery at the location, the channel body 20 and each electrode layer WL intersect at the location.

The semiconductor memory device in accordance with an embodiment can electrically erase and write data freely and store memory contents even after a power source is turned off.

The memory cell is, for example, a charge trap type of memory cell. The charge storage film 32 includes a number of trap sites that captures the electric charge and is, for example, a silicon nitride film.

The tunnel insulating film 31 becomes a potential barrier when the electric charges are injected to the charge storage film 32 from the channel body 20 or the electric charges accumulated in the charge storage film 32 diffuse to the channel body 20. The tunnel insulating film 31 is, for example, a silicon oxide film.

Alternatively, the tunnel insulating film 31 may be used a stacked film, the stacked film (ONO film) including a structure in which a silicon nitride film is interposed a pair of silicon oxide films. If the ONO film is used as the tunnel insulating film 31, an erase operation can be performed in a low electric field when compared with a single layer of the silicon oxide film.

The block insulating film 35 prevents diffusion of the electric charges accumulated in the charge storage film 32 to the electrode layer WL. The block insulating film 35 includes a cap film 34 and a block film 33, the cap film 34 is provided in contact with the electrode layer WL, the block film 33 is provided between the cap film 34 and the charge storage film 32.

The block film 33 is, for example, a silicon oxide film. The cap film 34 has a greater dielectric constant than that of oxide silicon, the cap film 34 is, for example, a silicon nitride film. Providing such a cap film 34 in contact with the electrode layer WL can suppress back tunneling electrons injected from the electrode layer WL during erasing. In other words, using a stacked film made of the silicon oxide film and the silicon nitride film as the block insulating film 35 can enhance charge blocking characteristics.

As illustrated in FIG. 1, a drain-side select transistor STD is provided at the top end portion of the column CL in the memory string MS, and a source-side select transistor STS is provided at the bottom end portion of the column CL in the memory string MS.

The memory cell, the drain-side select transistor STD and the source-side select transistor STS are each a vertical transistor in which a current flows in the stacking direction of the stacked body.

The drain-side select gate SGD functions as a gate electrode (control gate) for the drain-side select transistor STD. The insulating film that functions as a gate insulating film for the drain-side select transistor STD is provided between the drain-side select gate SGD and the channel body 20.

The source-side select gate SGS functions as a gate electrode (control gate) for the source-side select transistor STS. The insulating film that functions as a gate insulating film for the source-side select transistor STS is provided between the source-side select gate SGS and the channel body 20.

A plurality of the memory cells is provided between the drain-side select transistor STD and the source-side select transistor STS, the plurality of the memory cells uses each of the plurality of electrode layers WL as a control gate.

A plurality of the memory cells, the drain-side select transistor STD and the source-side select transistor STS are serially connected through the channel body 20 and configure the memory string MS. A plurality of the memory strings MS is arranged in the X-axis and Y-axis directions within the memory region Rm so as to provide a plurality of the memory cells three-dimensionally in the X-axis, Y-axis and Z-axis directions.

FIG. 3B illustrates a plane parallel to the X and Y planes in FIG. 3A.

As illustrated in FIG. 3A and FIG. 3B, a first hook up region Rf, a first connection region Ra, a second connection region Rb, a transistor device region Rc (device portion) and a second hook up region Rw are provided in the periphery of the memory region Rm.

A second stacked body SI is sequentially provided in the first connection region Ra and the second connection region Rb. The second stacked body SI is separated from the first stacked body Sm and includes the same layer structure as the first stacked body Sm. In other words, each of the plurality of electrode layers WL and each of the plurality of insulating layers 40 are alternatively stacked in the second stacked body SI. Thus, the second stacked body SI has a number of stacked layers same as a number of stacked layers of the first stacked body Sm.

The second stacked body SI includes a first contact portion Ca and a second contact portion Cb. The first contact portion Ca is electrically connected to an external portion of the second stacked body SI. The second contact portion Cb is electrically connected to an external portion different from the first contact portion Ca.

The second stacked body SI includes stepped portions St1 and St2, the stepped portions St1 and St2 are provided in part of the upper faces of the respective electrode layers WL exposed. The number of steps of the stepped portions St1 and St2 is the same as the number of stacking layers of the electrode layer WL and may be arbitrary.

The first stepped portion St1 is provided on the first connection region Ra. The first contact portions Ca are provided on the upper faces of the respective electrode layers WL of the first stepped portion St1. The second stepped portion St2 is provided on the second connection region Rb. The second contact portions Cb are provided on the upper faces of the respective electrode layers WL of the second stepped portion St2.

The respective electrode layers WL provided at the same layer of the first stepped portion St1 and the second stepped portion St2 are sequentially provided with one another. In other words, the first contact portion Ca and the second contact portion Cb on the same layer are electrically connected.

The first stacked body Sm extends to the first hook up region Rf. The upper faces of the select gate layers extending from the memory region Rm (drain-side select gates SGD and source-side select gates SGS) are exposed in the first hook up region Rf.

Third contact portion Cf is provided on the upper face of the drain-side select gate SGD and the source-side select gate SGS in the first hook up region Rf. The third contact portion Cf is, for example, electrically connected to the first contact portion Ca via interconnects 61 and 62. As a result, the drain-side select gate SGD and the source-side select gate SGS are electrically connected to the second stacked body SI.

The third contact portions Cf may be provided, for example, on the electrode layers WL at the first hook up region Rf. Thus, the electrode layer WL is electrically connected to the second stacked body SI via the first contact portion Ca and the third contact portion Cf.

Transistor device region Rc is provided between the substrate 10 and the second stacked body SI. A device 70 is provided in the transistor device region Rc, the device 70 includes a fourth contact portion Cc. The device 70 drives, for example, the electrode layer WL, the drain-side select gate SGD and the source-side select gate SGS.

The fourth contact portion Cc is electrically connected, for example, to the second contact portion Cb via interconnects 63 and 64. Thus, the device 70 is electrically connected to the second stacked body SI and electrically connected to the drain-side select gate SGD, the source-side select gate SGS and the electrode layers WL via the second stacked body SI.

According to the embodiment, the second stacked body SI is provided separately from the first stacked body Sm with which the memory cell array 1 is provided. As mentioned above, it is possible to electrically connect the second stacked body SI to two different external portions. As a result, the second stacked body SI can be used as interconnect.

Further, the second stacked body SI may be formed in the same manufacturing process as the first stacked body Sm and formed separately from the first stacked body Sm in the final process. Therefore, no new interconnect layer needs to be stacked as the number of stacks of the memory cell array 1 increases. In other words, it is possible to suppress the expansion of an apparatus due to the increased number of stacks.

The first stacked body Sm includes a connection portion Sm1, the connection portion Sm1 has the same layer structure as the first stacked body Sm. The connection portion Sm1 extends in the X-axis direction from the first hook up region Rf and reaches the second hook up region Rw. In the second hook up region Rw, for example, the electrode layers WL of the first stacked body Sm are provided in a stepwise shape and respective electrode layers WL are electrically connected to the external portions.

The second stacked body SI is provided between the first hook up region Rf and the second hook up region Rw. The first stacked body Sm is integrally provided with the first hook up region Rf and the second hook up region Rw via the connection portion Sm1. Therefore, the second stacked body SI is held in the first stacked body Sm.

When doing so, the electrode layer WL of the first stacked body Sm is, for example, electrically connected to the external portion from the second hook up region, the source-side select gate SGS and the drain-side select gate SGD are electrically connected to the device 70 from the first hook up region via the second stacked body SI, the source-side select gate SGS is provided on the first stacked body Sm, and the drain-side select gate SGD is provided under the first stacked body Sm. Thus, the second stacked body SI can be used as a local interconnect so as to secure the interconnect of the memory cell array 1 without increasing the number of interconnects in the stacking direction.

FIG. 4A and FIG. 4B illustrate planes parallel to the X and Y planes according to the embodiment. Illustrations of interconnect or the like are omitted for simplicity of understanding in FIG. 4A and FIG. 4B.

As illustrated in FIG. 4A, eight layers of the electrode layer WL0 to WL7 are provided in the second stacked body SI. The eight layers of the electrode layer WL are stacked in the first stacked body Sm and the first connection portion Sm1 similarly to the second stacked body SI.

As illustrated in FIG. 4A and FIG. 4B, the third contact portion Cf1 provided on the drain-side select gate SGD in the first hook up region Rf is electrically connected to the first contact portion Ca1 of the second stacked body SI via the interconnect 61. Thus, the drain-side select gate SGD is electrically connected to the electrode layer WL0 of the second stacked body SI via the third contact portion Cf1 and the first contact portion Ca1.

The first contact portion Ca1 is electrically connected to the second contact portion Cb1 via the electrode layer WL0.

The second contact portion Cb1 is electrically connected to the fourth contact portion Cc1 of the transistor device region Rc via the interconnect 63. Thus, the electrode layer WL0 is electrically connected to a device 71 via the second contact portion Cb1 and the fourth contact portion Cc1. Therefore, the drain-side select gate SGD is electrically connected to the device 71 via the electrode layer WL0 of the second stacked body SI.

Similarly, the source-side select gate SGS of the first hook up region Rf is electrically connected to a device 72 via the electrode layer WL of the second stacked body SI.

According to the embodiment, the second stacked body SI may be used as a local interconnect layer independent from the first stacked body Sm of the memory region Rm. As a result, when the number of stacks of the stacked body is increased, the increase of the number of interconnects can be suppressed. In other words, lower cost and improvement of the yield of the semiconductor memory device can be realized.

In addition to the above, according to the embodiment, it is possible to treat the electrode layer WL of the first stacked body Sm and the second stacked body SI by a metal silicide process via separation portions 44 and 45 (insulating portion), the separation portions 44 and 45 is provided between the first stacked body Sm and the second stacked body SI, and the separation portions 44 and 45 separate the first stacked body Sm from the second stacked body SI. Further, when forming the first stacked body Sm and the second stacked body SI, for example, a sacrificial film may be formed in place of the electrode layer WL. Subsequently, the column CL is formed in the memory region Rm and the sacrificial film may be replaced by a metal via the separation portions 44 and 45. Thus, the resistance of the electrode layer WL can be lowered.

Further, the second stacked body SI, for example, includes the electrode layer WL in a floating state. The electrode layer WL in the floating state is provided between the electrode layers WL used as the interconnect. Thus, parasitic capacitance between the electrode layers WL can be reduced.

Figure 5A:
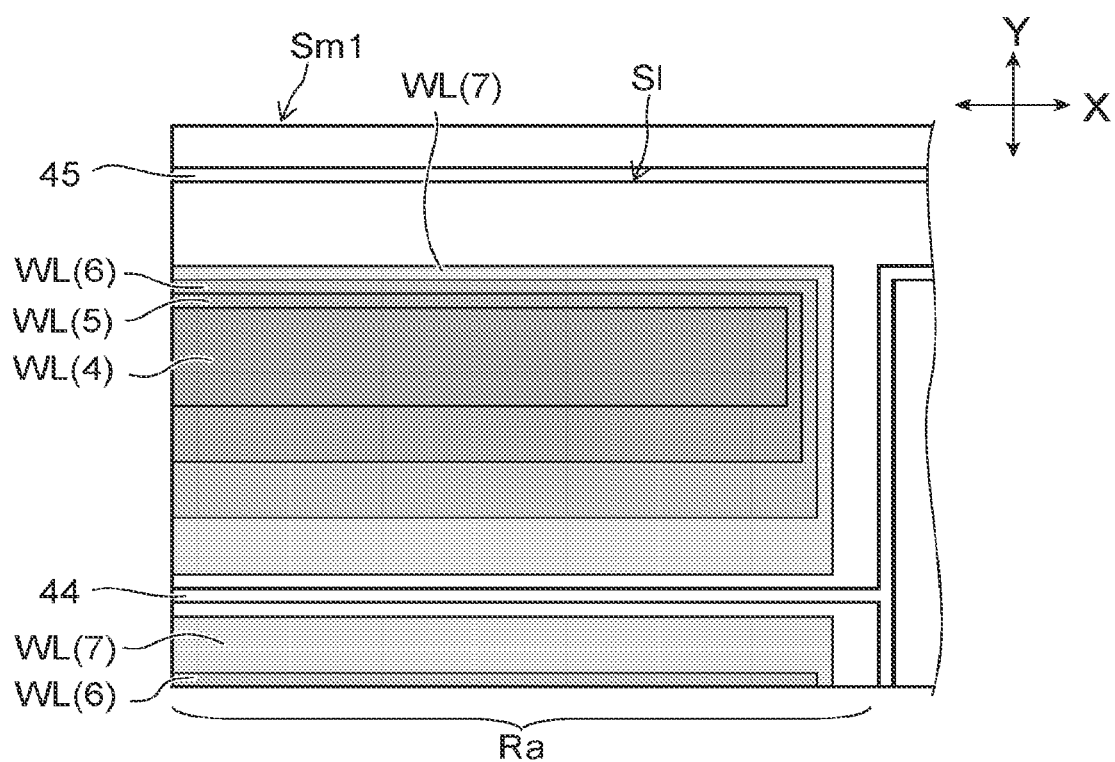
FIGS. 5A and 5B are schematic plan views of the semiconductor memory device in the embodiment.
Figure 5B:
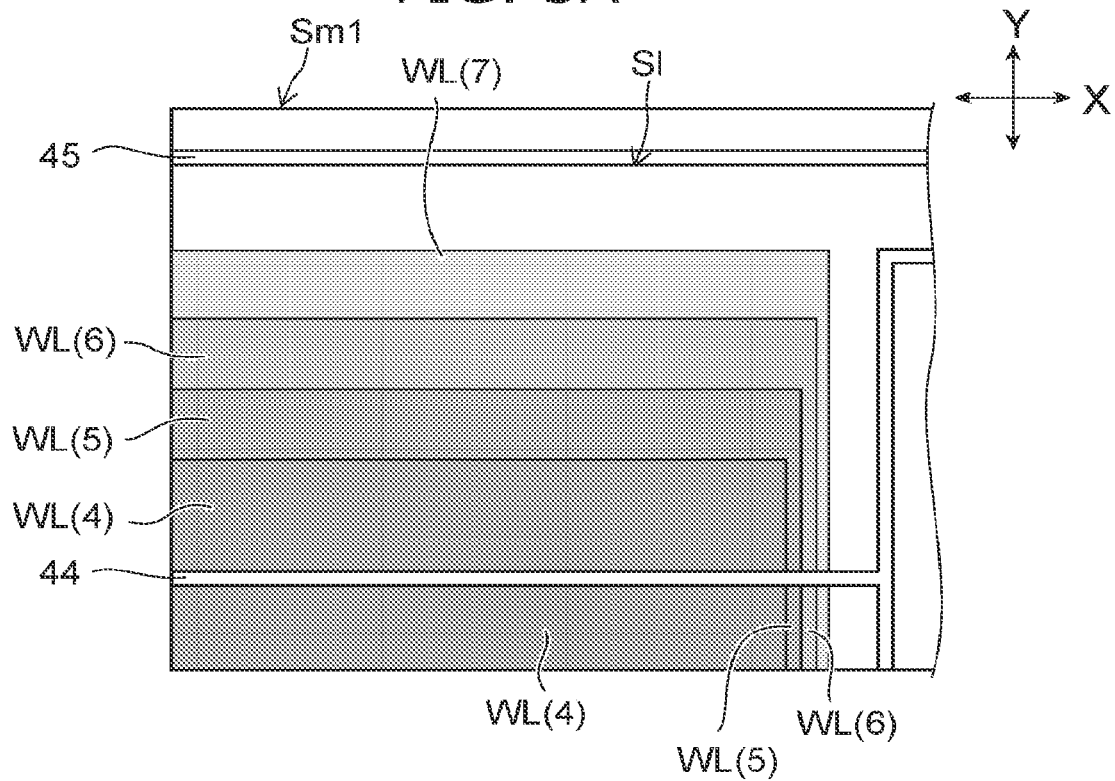

FIG. 5A and FIG. 5B illustrate the stepped portion of the second stacked body SI.

As illustrated in FIG. 5A, for example, the stepped portions St1 and St2 of the second stacked body SI are provided so that lower layers are surrounded by higher layers when viewed from the Z-direction (mortar shape).

As illustrated in FIG. 5B, for example, the stepped portions St1 and St2 are provided so that the aforementioned mortar shape is equally divided by the separation portion 44 (colosseum shape).

As a manufacturing method of the stepped portions St1 and St2 of the second stacked body SI, for example, a method that repeats photolithography and a reactive ion etching (RIE) method is utilized. This method enhances degree of freedom of step patterning.

In the method that combines photolithography and the RIE method, for example, combining processes of $2^n$ layers (n=0, 1, 2, 4, . . . ) allows for formation of steps at an optional place.

In the embodiment, the electrode layer WL of the second stacked body SI provided in a different region from the memory region Rm is used as the interconnect. As a result, when the transistor device region Rc is formed on the substrate 10, interconnect to the transistor device region Rc is facilitated. Thus, the transistor device region Rc may be provided between the substrate 10 and the second stacked body SI.

When doing so, the transistor device region Rc is covered by the electrode layer WL and unable to connect to an external portion other than the second stacked body SI. Therefore, a hole or the like is formed to create a region in which the electrode layer WL is absent, the hole or the like passes through the second stacked body SI.

As a method of forming the hole or the like, for example, the aforementioned method is utilized, the method repeats photolithography and the RIE method. The hole may be formed by a method collectively manufacturing the second stacked body SI. The transistor device region Rc, for example, may connect to an external portion if a contact portion is provided at the opening of the second stacked body SI.

For example, part of the drain-side select gate SGD and the source-side select gate SGS may be formed around the lower portion of the second stacked body SI to connect with the transistor device region Rc.

According to the embodiment, forming of a plurality of blocks that includes the contact portions of the second stacked body SI and the first stacked body Sm in the Y-axis direction enables collective forming of the transistor device region Rc.

As illustrated in FIG. 4A, a mirror image of the shapes of the first stacked body Sm and the second stacked body SI is provided at the separation portion 44 located at a border with regard to the X and Z planes, and a second connection portion Sm2, which is a mirror image of the first connection portion Sm1, is provided at the separation portion 44 located at a border.

The separation portion 45 is provided between the first connection portion Sm1 and the second stacked body SI. A plurality of the blocks, with one block made of the first stacked body Sm, the first connection portion Sm1 and the second stacked body SI, is provided in the Y-axis direction. In other words, two blocks are provided on both sides of the separation portion 44 in the Y-axis direction in FIG. 4A.

The transistor device region Rc is provided between the first connection portion Sm1 and the second connection portion Sm2. In other words, the transistor device region Rc required for the two blocks is integrally provided. The periphery of the second stacked body SI is encompassed by the first stacked body Sm which includes the first connection portion Sm1 and the second connection portion Sm2.

Figure 6A:
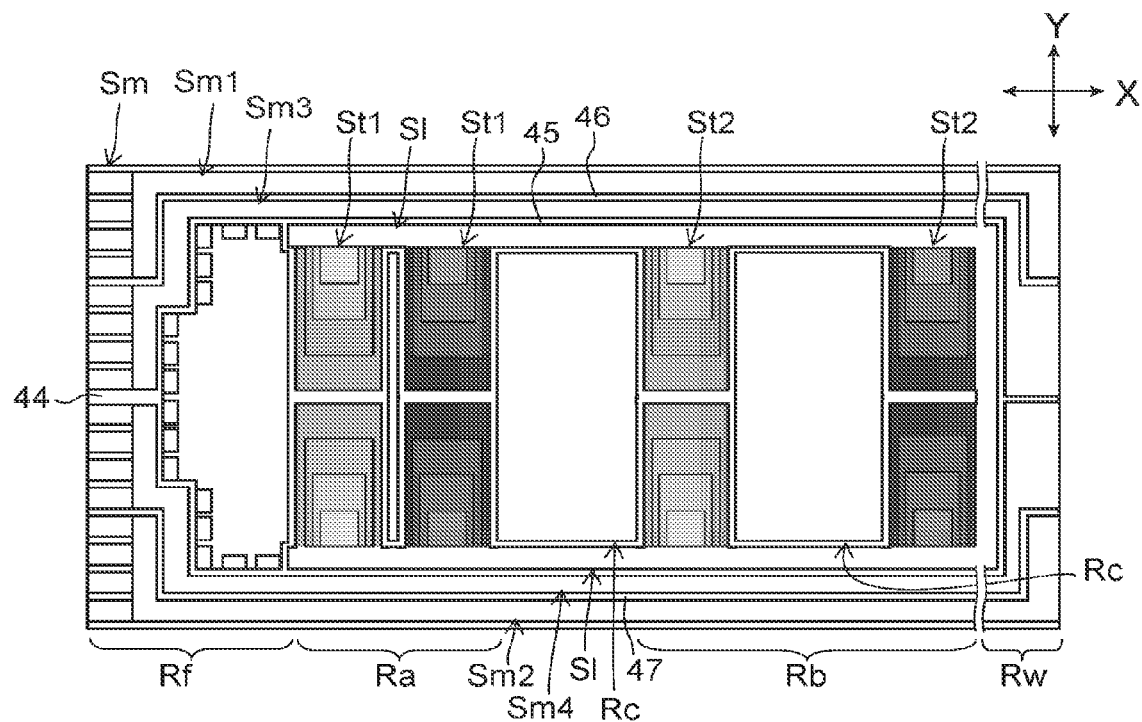
FIGS. 6A and 6B are schematic plan views of the semiconductor memory device in the embodiment.
Figure 6B:
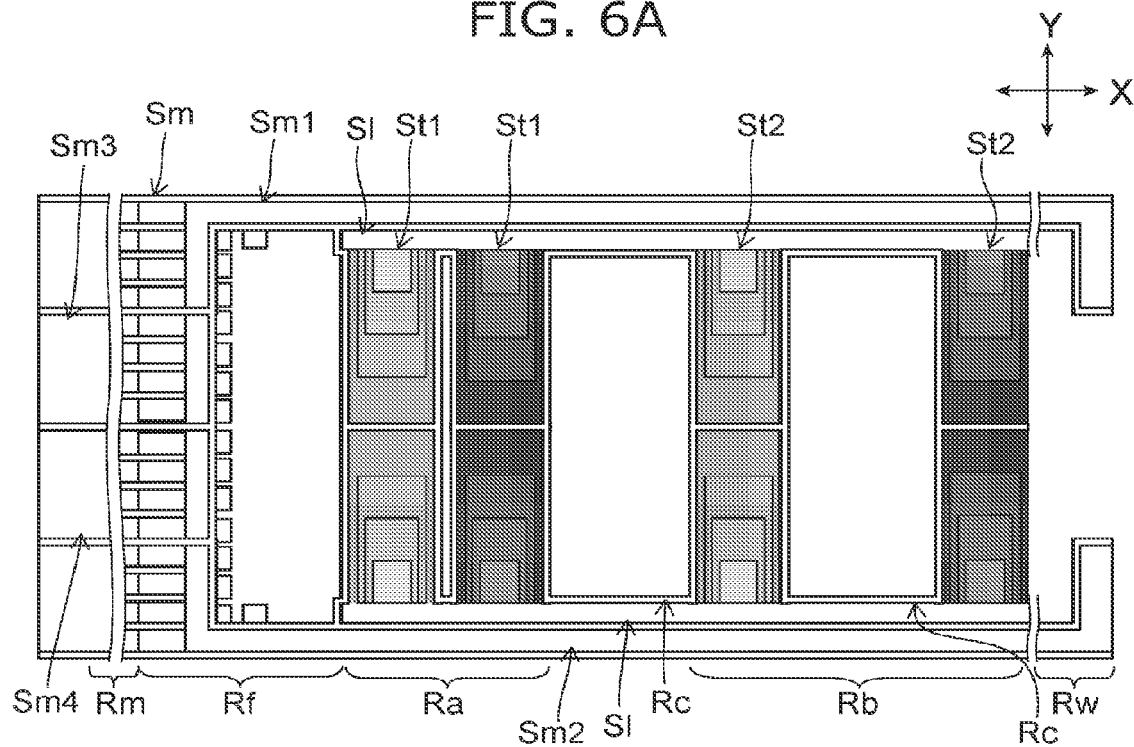

As illustrated in FIG. 6A and FIG. 6B, the connection portions of the second stacked body SI and the first stacked body Sm (the first connection portion Sm1, the second connection portion Sm2, a third connection portion Sm3, and a fourth connection portion Sm4) are provided. In other words, four blocks are provided.

The transistor device region Rc is provided between the first connection portion Sm1 and the second connection portion Sm2.

The third connection portion Sm3 is provided between the first connection portion Sm1 and the transistor device region Rc. The third connection portion Sm3 extends in parallel with the first connection portion Sm1 and an insulating portion 46 from the first stacked body Sm and reaches the second hook up region Rw.

The fourth connection portion Sm4 is provided between the second connection portion Sm2 and the transistor device region Rc. The fourth connection portion Sm4 extends in parallel with the second connection portion Sm2 and an insulating portion 47 from the first stacked body Sm and reaches the second hook up region Rw.

In other words, the transistor device region Rc required for the four blocks is integrally provided between the third connection portion Sm3 and the fourth connection portion.

As illustrated in FIG. 6B, the transistor device region Rc is provided between the first connection portion Sm1 and the second connection portion Sm2.

Each of the third connection portion Sm3 and the fourth connection portion Sm4 extends in a different direction from the second stacked body SI provided from the memory region Rm.

In other words, the transistor device region Rc required for the four blocks is integrally provided between the first connection portion Sm1 and the second connection portion Sm2.

As a result, the optimal contact position can be secured for the transistor device region Rc and the external portion, improving the speed and reliability of the memory device.

Figure 7A:
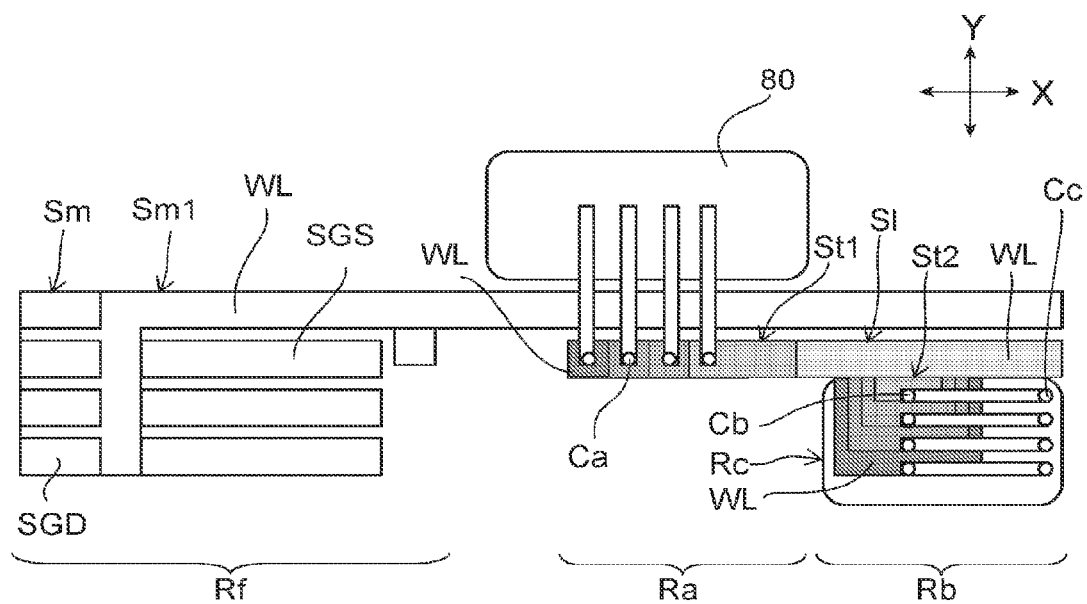
FIGS. 7A and 7B are schematic plan views of the semiconductor memory device in the embodiment.

In addition to the above, as illustrated in FIG. 7A, for example, a controller 80 that includes a power source for supplying the current and a signal part for inputting and outputting signals is provided. The controller 80 is electrically connected to the transistor device region Rc via the second stacked body SI. As a result, the controller 80 can supply the current to the transistor device region Rc, and input and output signals.

Figure 7B:
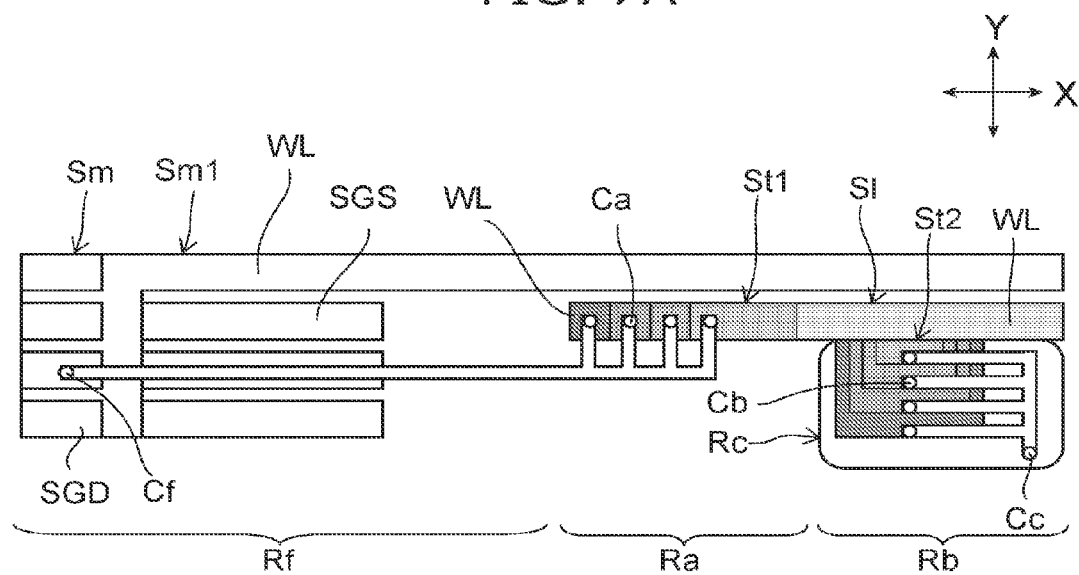

Further, the plurality of electrode layers WL of the second stacked body SI may be electrically connected in parallel to the external portions. As illustrated in FIG. 7B, for example, the third contact portion Cf of the first hook up region Rf is electrically connected to the fourth contact portion Cc of the transistor device region Rc via the plurality of first contact portions Ca of the first connection region Ra and the plurality of second contact portions Cb of the second connection region Rb. As a result, deterioration of a time constant can be suppressed.

Thereby, according to the embodiment, the expansion of a semiconductor device due to the increased number of stacks can be suppressed while lower cost, improvement of the yield, the speed and reliability can be realized.

Figure 8:
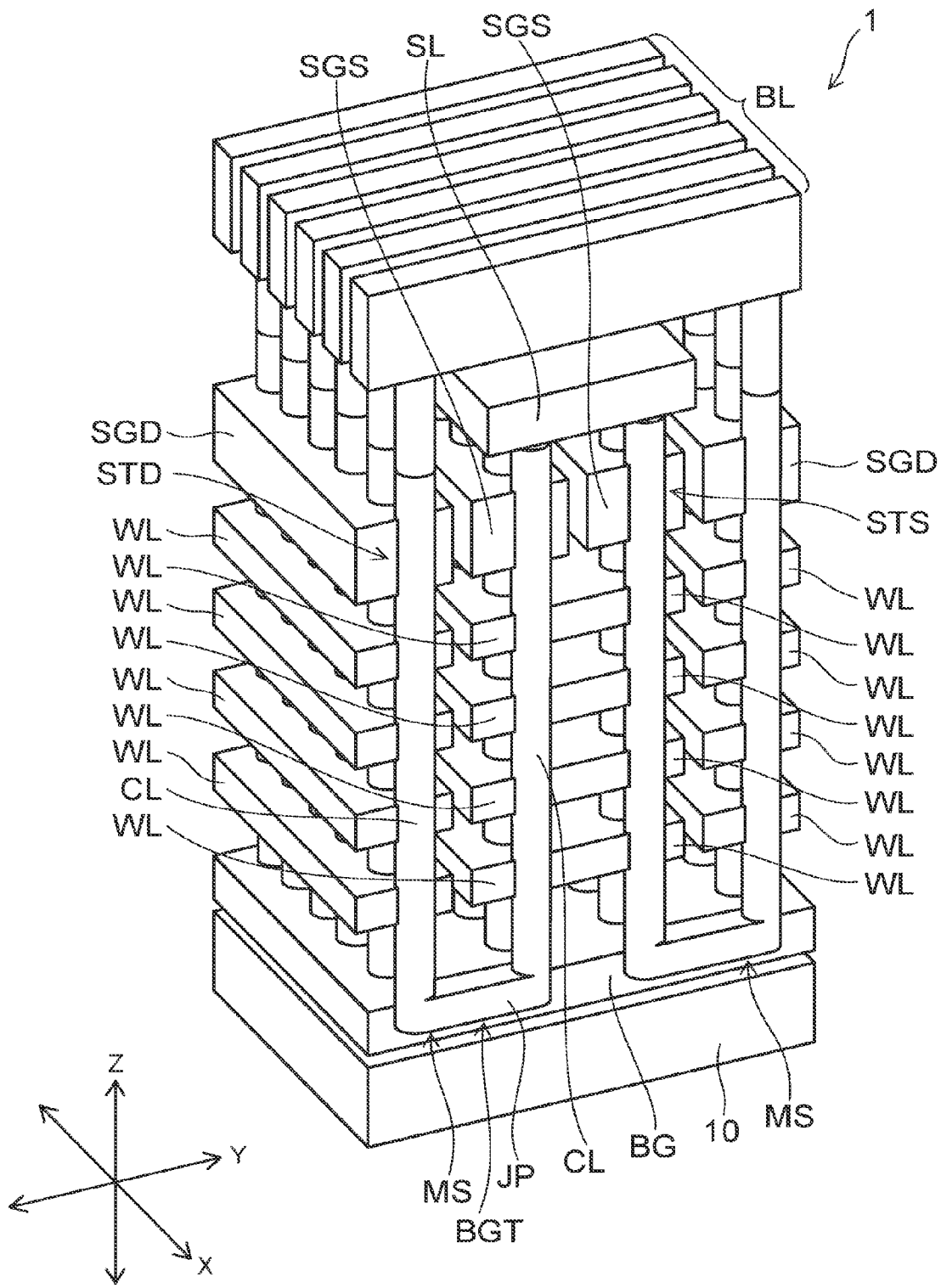
FIG. 8 is a schematic perspective view of a memory cell array in another embodiment.

FIG. 8 is a schematic perspective view of a memory cell array 2 in another example of the semiconductor memory device according to an embodiment. As in FIG. 1, illustrations of the insulating layer or the like are omitted for simplicity of understanding in FIG. 8.

A back gate BG is provided on the substrate 10 intermediated by an insulating layer. A stacked body in which the plurality of electrode layers WL and a plurality of inter layer insulating layers are alternatively stacked is provided on the back gate BG.

One memory string MS is formed in a U-shape that includes a pair of the columns CL extending in the Z-axis direction and a connection member JP linking each of the bottom ends of the pair of the columns CL. The column CL is formed, for example, in a circular column shape or an elliptic column shape and passes through the stacked body and reaches the back gate BG.

The drain-side select gate SGD is provided at the top end portion of one side of the pair of columns CL in the U-shape memory string MS and the source-side select gate SGS is provided at the top end portion of the other side. The drain-side select gate SGD and the source-side select gate SGS are provided on the topmost layer of the electrode layer WL intermediated by the inter layer insulating layer 40.

The drain-side select gate SGD and the source-side select gate SGS are separated in the Y-axis direction by an insulating separate portion. The stacked body under the drain-side select gate SGD and the stacked body under the source-side select gate SGS are separated in the Y-axis direction by the insulating separate portion. In other words, the stacked bodies between a pair of the columns of the memory string MS are separated in the Y-axis direction by the insulating separate portion.

The source layer SL (for example, a metal film) is provided on the source-side select gate SGS intermediated by the insulating layer. A plurality of bit lines (for example, the metal film) BL is provided on the drain-side select gate SGD and the source layer SL intermediated by the separation portion 44. Each bit line BL extends in the Y-axis direction.

Similarly, to the aforementioned embodiment, the second stacked body SI separated from the stacked body that includes the memory cell array 2 is also used as the interconnect in the memory cell array 2 illustrated in FIG. 8. Thereby, the expansion of a semiconductor device due to the increased number of stacks can be suppressed while lower cost, improvement of the yield, the speed and reliability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
    a substrate;
    a first stacked body provided on the substrate, the first stacked body including a plurality of electrode layers and a plurality of insulating layers, each of the plurality of insulating layers being provided between the plurality of electrode layers;
    a semiconductor film provided in the first stacked body and extending in a stacking direction of the first stacked body; and
    a second stacked body provided on the substrate and separately from the first stacked body, the second stacked body including a same layer structure as the first stacked body, the second stacked body including:
        a first contact portion electrically connected to an external portion; and
        a second contact portion electrically connected to an external portion different from the first contact portion;
    wherein the first stacked body includes a third contact portion electrically connected to the first contact portion.

2. The memory device according to claim 1, further comprising:
    a device portion including a fourth contact portion electrically connected to the second contact portion,
    wherein the first stacked body is electrically connected to the device portion via the second stacked body.

3. The memory device according to claim 2, wherein the device portion is provided between the substrate and the second stacked body, and separated from the second stacked body.

4. The memory device according to claim 1, wherein the second stacked body includes a stepped portion, the stepped portion is provided in part of an upper face of the plurality of electrode layers exposed.

5. The memory device according to claim 4, wherein the upper face of the plurality of electrode layers is provided in a mortar shape at the stepped portion.

6. The memory device according to claim 4, wherein the upper face of the plurality of electrode layers is provided in a colosseum shape at the stepped portion.

7. The memory device according to claim 1, wherein the electrode layers include a metal.

8. The memory device according to claim 1, wherein the second stacked body is surrounded with the first stacked body.

9. The memory device according to claim 1, wherein the plurality of electrode layers of the second stacked body includes an electrode layer in a floating state.

10. The memory device according to claim 1, further comprising:
    an insulating portion provided between the first stacked body and the second stacked body.

11. The memory device according to claim 2, wherein the plurality of electrode layers of the second stacked body is electrically connected to the device portion in parallel.

12. The memory device according to claim 2, further comprising:
    a controller including:
        a power source supplying a current to the device portion; and a signal part inputting and outputting signals to the device portion;

wherein the controller is electrically connected to the device portion via the second stacked body.

13. A semiconductor memory device comprising:
a substrate;
a first stacked body provided on the substrate, the first stacked body including a plurality of electrode layers and a plurality of insulating layers, each of the plurality of insulating layers being provided between the plurality of electrode layers;
a semiconductor film provided in the first stacked body and extending in a stacking direction of the first stacked body; and
a second stacked body provided on the substrate and separately from the first stacked body, the second stacked body including a same layer structure as the first stacked body, the second stacked body including:
a first contact portion electrically connected to an external portion; and
a second contact portion electrically connected to an external portion different from the first contact portion;
wherein the first stacked body includes:
a select gate layer provided at least either at a bottommost layer or a topmost layer of the first stacked body; and
a third contact portion provided on an upper face of the select gate and electrically connected to the first contact portion.

14. A semiconductor memory device comprising:
a substrate;
a first stacked body provided on the substrate, the first stacked body including a plurality of electrode layers and a plurality of insulating layers, each of the plurality of insulating layers being provided between the plurality of electrode layers;
a semiconductor film provided in the first stacked body and extending in a stacking direction of the first stacked body; and
a second stacked body provided on the substrate and separately from the first stacked body, the second stacked body including a same layer structure as the first stacked body, the second stacked body including:
a first contact portion electrically connected to an external portion; and
a second contact portion electrically connected to an external portion different from the first contact portion;
wherein the plurality of electrode layers of the first stacked body is electrically connected to the second stacked body via the first contact portion.

* * * * *